United States Patent [19]

Beauducel

[11] Patent Number: 4,983,925
[45] Date of Patent: Jan. 8, 1991

[54] SIGNAL SAMPLING DEVICE FOR MINIMIZING THE ERRORS EFFECTING SUCCESSIVELY STORED SIGNAL SAMPLES

[75] Inventor: Claude Beauducel, Henonville, France

[73] Assignee: Institut Francais du Petrole, Rueil-Malmaison, France

[21] Appl. No.: 279,080

[22] Filed: Dec. 2, 1988

[30] Foreign Application Priority Data

Dec. 2, 1987 [FR] France ............... 87 16848

[51] Int. Cl.$^5$ ............... H03K 5/00; H03K 5/159; G06G 7/16; G06G 7/00
[52] U.S. Cl. ............... 328/151; 307/529; 307/353
[58] Field of Search ............... 328/151, 162, 165; 307/352, 353, 529

[56] References Cited

U.S. PATENT DOCUMENTS

| | | | |
|---|---|---|---|
| 3,641,563 | 2/1972 | Cushman et al. | 341/115 |
| 4,004,239 | 1/1977 | Clarke | 307/353 |
| 4,352,070 | 9/1982 | Beauducel et al. | 307/353 |
| 4,691,125 | 9/1987 | Rybichi | 307/353 |

OTHER PUBLICATIONS

George Erdi, "A Precision FET-Less Samle-and-Hold with High Charge-to-Droop Current Ratio", IEEE Journal of Solid-State Circuits, vol. SC-13, No. 16, Dec. 1978, pp. 864-873.
French Search Report, FR 8716848.

*Primary Examiner*—Stanley D. Miller
*Assistant Examiner*—Trong Quang Phan
*Attorney, Agent, or Firm*—Antonelli, Terry, Stout and Kraus

[57] ABSTRACT

An improved device for sampling signals to minimize the errors introduced in the stored samples includes first and second sampling elements whose respective sampling and holding periods are offset with respect to each other, an amplifier applying a gain G to the difference between the input voltage and the sample stored by the first element, before transmitting it to the second element, and a summing circuit for adding to the samples stored by the first element a fraction of the samples stored by the other element. The sampling errors are reduced by a factor G equal to the gain value.

4 Claims, 2 Drawing Sheets

SIGNAL SAMPLING DEVICE FOR MINIMIZING THE ERRORS EFFECTING SUCCESSIVELY STORED SIGNAL SAMPLES

BACKGROUND OF THE INVENTION

The present invention relates to an improved sampling device for minimizing errors affecting successively stored signal samples.

FIELD OF THE INVENTION

Acquisition of a signal by a digitization chain generally comprises the application to the input of an analog-to-digital converter of signal samples taken from the signal with a given sampling frequency and storage of each of samples during a time interval sufficient for conversion of the samples into a digital word. The signal samples are taken and stored by electronic circuits well known by specialists and designated as sample-and-hold circuits.

For different reasons related to the imperfections of the component elements of sample-and-hold circuits, the amplitudes of the stored samples are affected by errors. There may be systematic errors or dynamic errors, depending on the magnitude of the magnitude variations of the successive signal samples. In this case, it can be observed that the amplitude of a signal sample is not independent of the stored value of the preceding sample. The separating power of a sample-and-hold circuit is defined by a so-called cross-talk rate whose usual values are of the order of $-80$ dB. In some cases, particularly in the field of seismic prospection where precise digitization of the stored samples is carried out, the cross-talk rate between samples must be very much less than these usual values.

DESCRIPTION OF THE PRIOR ART

From French patent No. 2,453,471 (corresponding to the U.S. Pat. No. 4,352,070), a sample-and-hold circuit is known comprising a capacitor for storing electric voltage samples and means for applying the voltage to be stored to the storage capacitor during sampling periods and for isolating the storage capacitor during holding periods. This sample-and-hold circuit comprises a passive compensation circuit having a second capacitor, adapted for reproducing the real characteristics of the storage capacitor, this circuit being connected between the output of the sample-and-hold circuit and ground, means for intermittently short-circuiting the second capacitor and means for subtracting a fraction of the voltage applied to the terminals of the second capacitor from the value of the voltage applied to the storage capacitor.

This sample-and-hold circuit is particularly adapted to the compensation of faults inherent in its storage capacitor.

SUMMARY OF THE INVENTION

The device of the present invention is adapted for sampling any signal with a reduced error rate. It comprises a first sampling element to which the signal to be sampled is applied and a second sampling element whose sampling period is delayed, with respect to that of the first sampling element, by a time interval less than the acquisition time of the sampling elements, amplification means for applying an amplification gain to the difference between the amplitude of the signal at the input of the first element and of the signal at the output thereof, the output of the amplification means being connected to the input of the second element, and summation means for adding to the signal from the first element a fraction of the signal coming from the second element so as to reduce the errors applied to the signal samples by the second element.

The device of the invention greatly reduces all the faults introduced by a sample-and-hold circuit, whether the faults are due to the storage capacitor or to the electronic elements associated with this capacitor. The invention avoids the need for sample-and-hold circuits of hybrid manufacture, which are costly and which consume much electric current and thus, which are not compatible with the manufacture of complex acquisition systems in which a multiplicity of acquisition boxes including such sample-and-hold circuits are distributed along a seismic streamer of very great length.

BRIEF DESCRIPTION OF THE DRAWINGS

The advantages of the invention will be better understood from the following description concerning one embodiment, given by way of non-limitative example, with reference to the accompanying drawings in which.

DESCRIPTION OF THE PREFERRED EMBODIMENT

Figure 1:
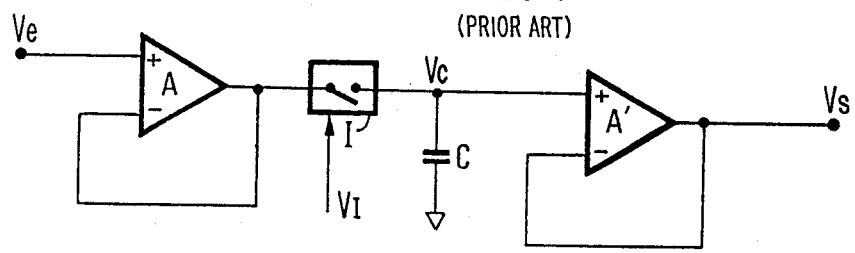
FIG. 1 shows one known example of a sample-and-hold circuit.

The sample-and-hold circuit of known type illustrated in FIG. 1 comprises two operational amplifiers A and A' disposed in series, the output of the first one being connected by a switch I, preferably an electronic switch, to the non inverting input of the second amplifier A', which is also connected to ground through a capacitor C. The output impedance of the first amplifier A is small whereas the input impedance of the second is very high. The first amplifier A is an isolating amplifier with unity gain whose output signal reproduces the signal $V_e$ applied to its non inverting input.

Figure 2:
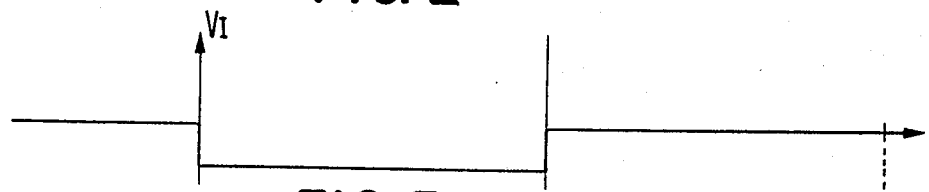
FIG. 2 shows a timing diagram of the control voltage of a sample-and-hold circuit, for intermittently storing a signal to be sampled.
Figure 3:
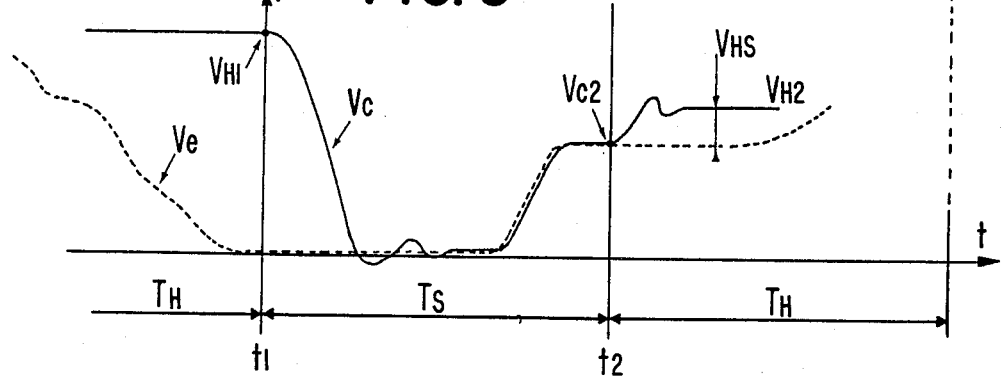
FIG. 3 shows the respective variations of a signal applied to the input of a sample-and-hold circuit and of the corresponding signals at the terminals of the storage capacitor thereof.
Figure 4:
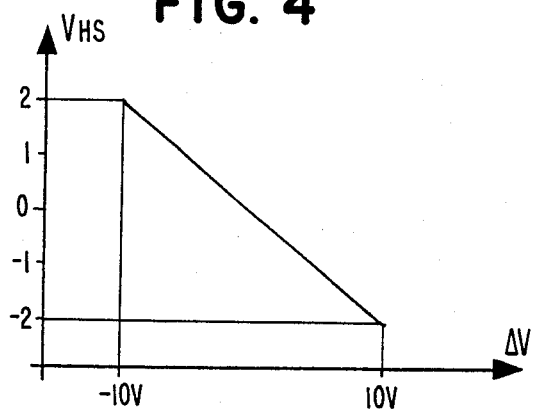
FIG. 4 shows, in an approximate way, the variation of the error introduced by a sample-and-hold circuit as a function of the difference of amplitude between two successive signal samples.

During a holding time interval $T_H$ ending at time $t_1$ (FIGS. 2, 3), switch I is open. The input impedance of amplifier A' being very high, the voltage $V_c$ on capacitor c is kept practically at a constant value $V_H$ during this so-called holding time interval. That voltage corresponds to the value of the sample taken at time $t_1$. It is assumed that, during this holding time interval $T_H$, the input signal $V_e$ has decreased very rapidly because it has high variation dynamics. At time $t_1$ and up to the subsequent time $t_2$, a control signal $V_I$ (FIG. 2) is applied to switch I so as to close it. The time interval $(t_1, t_2)$ defines a sampling period $T_S$. The voltage Vc decreases until it reaches the input voltage Ve and follows it in its variations. But at time $t_2$ when switch I is again opened, initiating a new rolding period $T_H$, voltage $V_c$, and consequently voltage $V_S$ at the output of amplifier $A_2$, instead of maintaining the value $V_{c2}$ reached at the end of the sampling period $T_S$, undergoes a sudden variation and is held at a value $V_{H2}$. It can also be seen that the difference $V_{HS}$ between the voltages $V_{H2}$ and $V_{c2}$ depends on the amplitude variation $\Delta V$. undergone by the input signal from the preceding sampling time. In general, this variation $\Delta V$ is substantially linear (FIG. 4).

The error $V_{HS}$ results from several different causes. The most notable relates to the imperfections of the storage capacitor C which is equivalent to a theoretical capacitor without loss connected in parallel with a circuit comprising a resistor in series with a capacitor. The error $V_{HS}$ is also due to the non-linearity of the amplifying stages, such as A, or A', as well as to the defects inherent in the electronic switch I. The reduction of this error becomes necessary when an analog-to-digital converter is used with high dynamics (delivering for example 15 bit digital words). The sampling and holding assembly shown in FIG. 5 reduces very greatly the differences $V_{HS}$, whether they are due to the storage capacitors or to the associated electronic elements.

Figure 5:
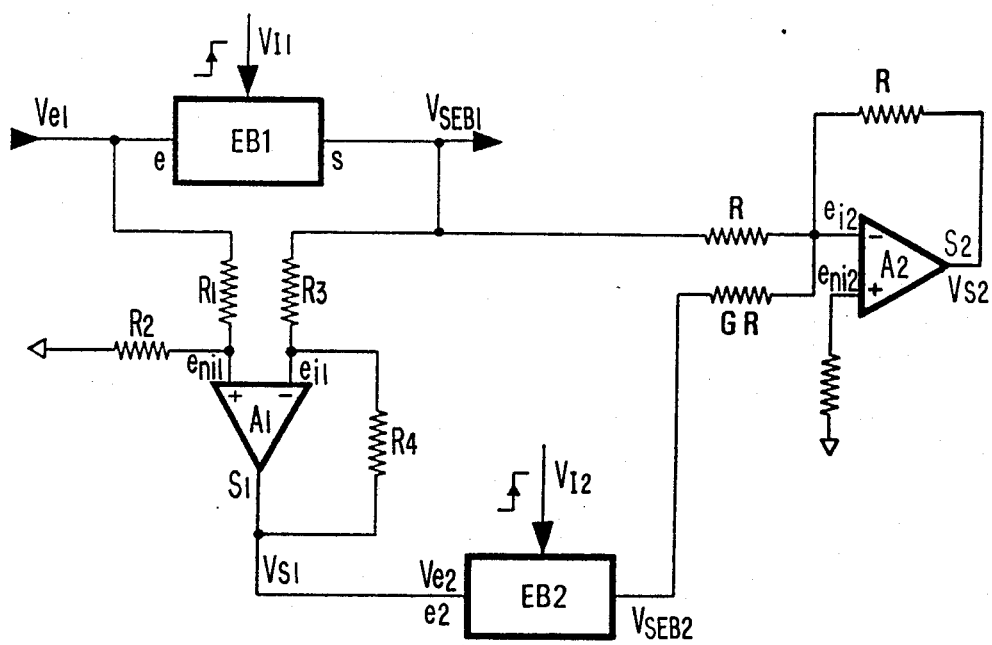
FIG. 5 shows a preferred embodiment of the device of the invention.
Figure 6:
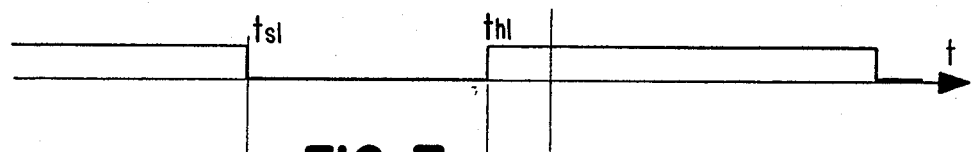
FIGS. 6 and 7 shows respectively the timing diagrams of the control signals of two sample-and-hold circuits included in the device of FIG. 5.
Figure 7:
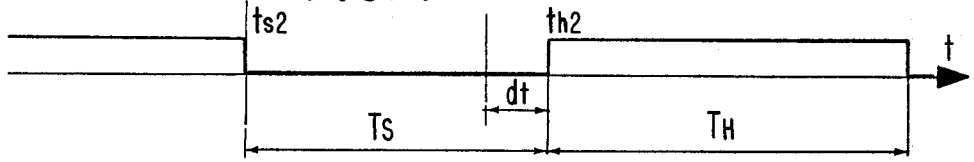

The assembly of FIG. 5 comprises a first sample-and-hold circuit $EB_1$ capable of providing, during all its holding phases, correct storage of the voltage $V_e$ which is applied thereto. The signal at the input e of the element $EB_1$ and the signal available at the outputs of the same element are applied respectively to the non-inverting input $eni_1$ and to the inverting input $ei_1$ of a differential amplifier $A_1$ whose gain has a predetermined value G. The application of these two signals is provided through a conventional network of four electric resistors. Two of them ($R_1$, $R_2$), disposed in series connect the input e to ground. The middle point of resistors $R_1$, $R_2$ is connected to the non-inverting input $eni_1$ of amplifier A1. The other two resistors ($R_3$, $R_4$), disposed in series, connect the output s to the output $s_1$ of amplifier $A_1$, and their middle point is connected to the inverting input $ei_1$ of that amplifier.

The output $s_1$ of amplifier $A_1$ is connected to the input $e_2$ of a second sample-and-hold circuit $EB_2$ whose errors are to be corrected. The output of element $EB_1$ is also connected to the inverting input $ei_2$ of a second amplifier $A_2$ through a resistor R. This same input $ei_2$ is also connected to the output of element $EB_2$ through a resistor of value GR, G being the gain of the first amplifier $A_1$.

A control signal $VI_1$ is applied to the control input of the first sample-and-hold circuit $EB_1$ so as to alternately cause closure of its internal switch I (FIG. 1) at times $ts_1$ (beginning of the sampling period) and opening of that switch I at times $th_1$ (beginning of the storage and holding period). Similarly, a control signal $VI_2$ is applied to the control input of the second sample-and-hold circuit $EB_2$, so as to alternately cause closure (at time $ts_2$) and opening (at time $th_2$) of its internal switch I. The control signals are such that the time $th_2$ of control signal $V_{I2}$ offset in time with respect to time $th_1$ by an interval dt greater than the acquisition time proper of each sample-and-hold circuit.

The device operates in the following way:

$V_{eH}$ designates the value of the input voltage $V_{e1}$ stored at any holding time $th_1$ of the sample-and-hold circuit $EB_1$, and $V_{HS1}$ designates the amplitude of the error introduced thereby. From this time $th_1$, the voltage applied to the inverting input $ei_1$ of amplifier $A_1$ is equal to $(V_{eH}+V_{HS1})$. The input voltage $V_{e1}$ is continually variable. By $(V_{eH}+u)$ is designated the value of $V_{e1}$ at the subsequent time $th_2$ when holding of the sample-and-hold circuit $EB_2$ is initiated. Since this value is then applied to the non inverting input $eni_1$ of amplifier $A_1$, the voltage $V_{S1}$ at the output $s_1$ thereof, amplified with a gain equal to G is:

$$V_{S1} = G[(V_{eH}+u)-(V_{eH}+V_{HS1})]$$

or $V_{S1} = G(u - V_{HS1})$ \hfill (1)

The voltage $V_{S1}$ is stored by the sample-and-hold circuit $EB_2$ which applies thereto an error which is designated by $V_{HS2}$.

To the inverting input $ei_2$ of amplifier $A_2$ are therefore applied (a) the voltage $(V_{eH}+V_{HS1})$ and (b) the voltage $(V_{S1}+V_{HS2})$ divided in a ratio G. The voltage measurable at the output $V_{S2}$ of the second amplifier $A_2$ is therefore expressed:

$$V_{S2} = -\left[\frac{G}{G}(u - V_{HS1}) + \frac{V_{HS2}}{G} + (V_{eH} + V_{HS1})\right]$$

which, by simplifying becomes $$V_{S2} = -\left[(V_{eH} + u) + \frac{V_{HS2}}{G}\right] \quad (2)$$

$(V_{eH}+u)$ represents the input value $V_{e1}$ at the time $th_2$, and so, it can be seen that the final the output of the device: is only affected by an error amplitude $V_{HS2/G}$ which is divided in a ratio G with respect to the error which would be experienced at the output of the sample-and-hold circuit $EB_2$ if it were used alone. This reduction affects the errors introduced whatever their cause.

The maximum value which is available to give to gain G for minimizing the error voltages as much as possible, is determined as a function of the maximum frequency of the signal $V_{e1}$ applied to the input of the device and as a function of the acquisition time $\tau$ proper to the sample-and-hold circuits, so that the voltage $V_{S1}$ (equation 1) never exceeds the maximum voltage that can be stored by element $EB_2$. The reduction of the error voltage provided by the device will be better if the frequency of sampling of the signals is not too high. This is the case, for example, for the multiplexed acquisition of the signals delivered by seismic receivers.

Without departing from the scope of the invention, a different value could be given to the product of the gain G of amplifier $A_1$ multiplied by the factor reducing the amplitude of the samples coming from the second sample-and-hold circuit.

What is claimed is:

1. An improved device for sampling an input signal with a reduced error rate, said device comprising:
   a first sampling element having a determined acquisition time for sampling the device input signal;
   a second sampling element having the determined acquisition time;
   means for applying a first control signal to said first sampling element to cause said first sampling element to have alternately a first sampling period and a first holding period;

means for applying a second control signal to said second sampling element to cause said second sampling element to have alternately a second sampling period and a second holding period, the second sampling period extending beyond the first sampling period by a time interval greater than the determined acquisition time;

amplifying means for amplifying the difference between the device input signal and the output signal of said first sampling element;

means connecting the output of said amplifying means to the input of said second sampling element; and adding means for adding to the output signal of said first sampling element a fraction of the output signal of said second sampling element, thereby reducing errors applied to signal samples by said second sampling element.

2. A device as claimed in claim 1 wherein:

said amplifying means comprises a first differential amplifier; and said adding means comprises means for amplifying the output of said first and second sampling elements, the output of said second sample element being amplified less than the output of said first sampling element.

3. A device as claimed in claim 2 wherein the ratio between the amplification of the output of said first sampling element and the amplification of the output of said second sampling element is equal to the gain of said first differential amplifier.

4. A sampling circuit comprising:

a first sampling element for sampling an input signal and providing an output signal indicative thereof;

a differential amplifier for providing a differential signal indicative of the difference between the input signal and the first sampling element output signal;

a second sampling element for sampling the differential signal and providing an output signal indicative thereof;

a summing amplifier for providing as the sampling circuit output the sum of the first sampling element output signal and a fraction of the second sampling element output signal.

* * * * *